United States Patent
Biruski et al.

(10) Patent No.: US 10,431,238 B1
(45) Date of Patent: Oct. 1, 2019

(54) MEMORY AND COMPUTATION EFFICIENT CROSS-CORRELATION AND DELAY ESTIMATION

(71) Applicant: Apple Inc., Cupertino, CA (US)

(72) Inventors: Dubravko Biruski, Palo Alto, CA (US); Sorin Dusan, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/999,120

(22) Filed: Aug. 17, 2018

(51) Int. Cl.
*G10L 21/0232* (2013.01)
*H04R 3/00* (2006.01)
*H04R 1/40* (2006.01)

(52) U.S. Cl.
CPC .......... *G10L 21/0232* (2013.01); *H04R 1/406* (2013.01); *H04R 3/005* (2013.01)

(58) Field of Classification Search
None
See application file for complete search history.

(56) References Cited

U.S. PATENT DOCUMENTS

| | | | |
|---|---|---|---|
| 2015/0016641 A1* | 1/2015 | Ugur | G10L 21/0216 381/303 |
| 2015/0264480 A1* | 9/2015 | Talwar | H04R 3/005 381/71.4 |
| 2018/0054683 A1* | 2/2018 | Pedersen | H04R 25/505 |

* cited by examiner

*Primary Examiner* — Paul W Huber
(74) *Attorney, Agent, or Firm* — Womble Bond Dickinson (US) LLP

(57) ABSTRACT

A digital processor-based memory-efficient and computation-efficient audio signal processing technique partitions each of two audio signals into shorter segments and combines the shorter segments into combined segments. A processor cross-correlates the first combined segment and the second combined segment into a cross-correlation result, which is written into a cross-correlation array. The result may be used for delay estimation (to estimate the relative delay between the two audio signals.) Other aspects are also described and claimed.

20 Claims, 5 Drawing Sheets

MEMORY AND COMPUTATION EFFICIENT CROSS-CORRELATION AND DELAY ESTIMATION

An aspect of the disclosure here relates to acoustic signal processing. Other aspects are also described.

BACKGROUND

Hearing aids have a microphone, amplifier and a speaker. They pick up sound through the microphone, amplify the resulting acoustic signal and produce sound from the speaker, so that a hearing-impaired listener can have improved hearing. Even so, the wearer of a hearing aid may have trouble hearing speech from a distant talker. A separate wired or wireless microphone may be placed closer to the talker and can therefore more strongly pick up the talker's speech, but ambient noise may obscure the picked up speech or can make speech comprehension challenging.

SUMMARY

A memory-efficient and computation-efficient cross-correlation technique is described that is especially suitable to be performed upon audio signals for delay estimation. Such a technique may be used for example to improve audio systems that are for listening to speech, when the listener is at a distance from the talker. A speech enhancement system for a remote microphone that improves the listening experience for a listener when the talker is at a distance is also described.

The memory-efficient and computation-efficient cross-correlation technique has a first array in memory, a second array in memory, and a cross-correlation array in memory. A processor is configured to receive a first audio signal. A first segment of the first audio signal is partitioned into a first plurality of stored or segments. The first plurality of shorter segments is combined into a first combined segment. The first combined segment is less than a size of the first segment, e.g. one tenth or less. The first combined segment is written into the first array.

The processor is configured to receive a second audio signal. A second segment of the second audio signal is partitioned into a second plurality of stored or segments. The second plurality of shorter segments is combined into a second combined segment. The second combined segment is less than a size of the second segment, e.g., one tenth or less. The second combined segment is written into the second array.

The processor is configured to cross-correlate the first combined segment, from the first array, and the second combined segment, from the second array. The result of the cross-correlation is written into the cross-correlation array. This result may then be used to estimate a delay between the two audio signals (where the two audio signals contain the same speech content that is misaligned in time or delayed relative to each other.) The estimated delay may then be used to align the two audio signals before feeding them to a 2-channel audio noise suppressor whose output produces a noise reduced audio signal (in which the speech content has effectively been enhanced.)

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

Several aspects of the disclosure here are illustrated by way of example and not by way of limitation in the figures of the accompanying drawings in which like references indicate similar elements. It should be noted that references to "an" or "one" aspect in this disclosure are not necessarily to the same aspect, and they mean at least one. Also, in the interest of conciseness and reducing the total number of figures, a given figure may be used to illustrate the features of more than one aspect of the disclosure, and not all elements in the figure may be required for a given aspect.

DETAILED DESCRIPTION

Figure 1:
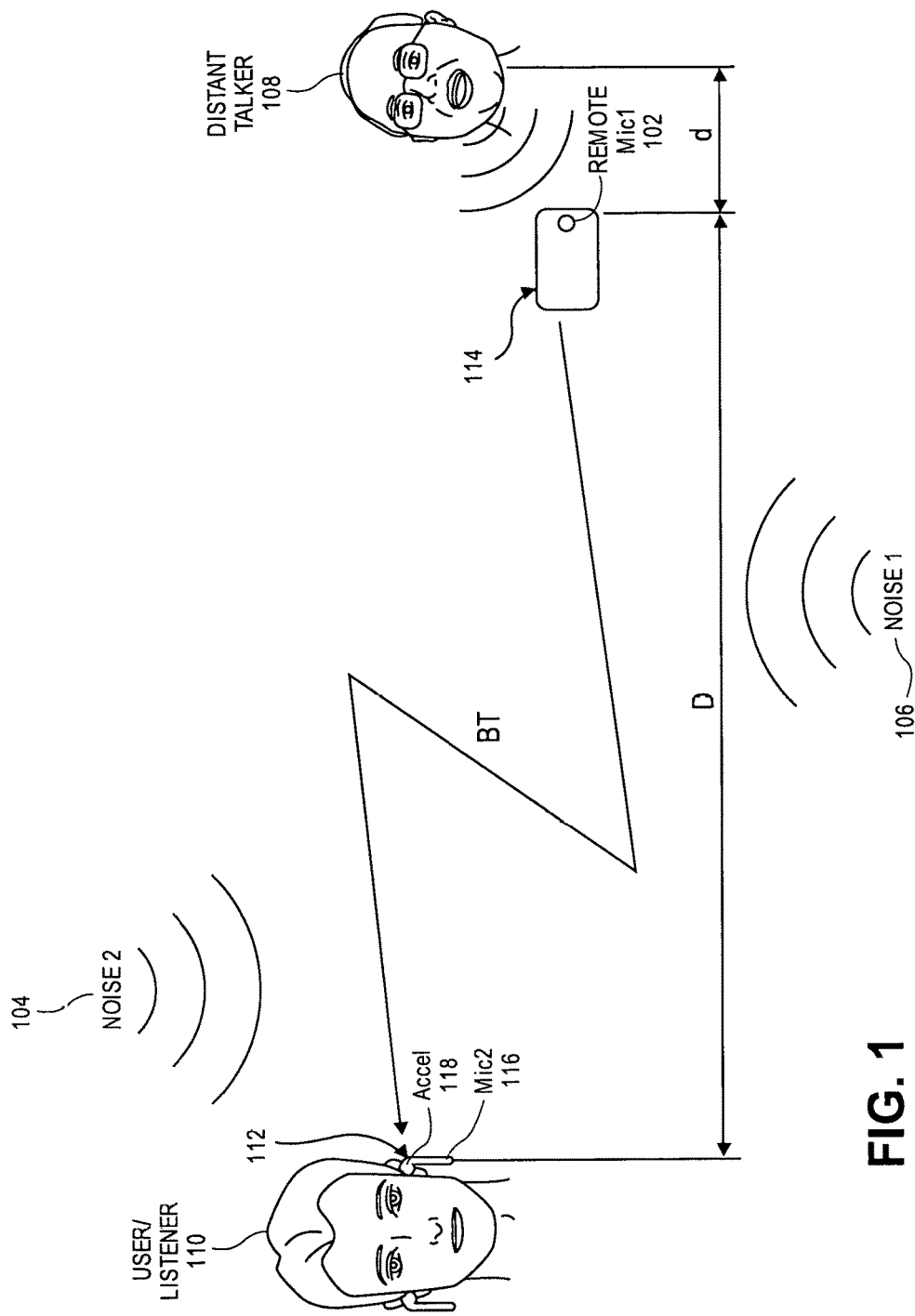
FIG. 1 depicts remote listening by a wearer of a headset, through a remote microphone in an acoustic environment with noises.

Several aspects of the disclosure with reference to the appended drawings are now explained. Whenever the shapes, relative positions and other aspects of the parts described are not explicitly defined, the scope of the invention is not limited only to the parts shown, which are meant merely for the purpose of illustration. Also, while numerous details are set forth, it is understood that some aspects of the disclosure may be practiced without these details. In other instances, well-known circuits, structures, and techniques have not been shown in detail so as not to obscure the understanding of this description.

A remote listening system described herein provides improved hearing in a noisy acoustic environment and solves a technological problem of how to more accurately receive speech or other sound from a distance, using a remote device with a remote microphone, and a local listening device with a speaker. The remote device with remote microphone, which could be a smart phone, wireless microphone, wireless communication device or other wireless device in various versions, is placed close to a sound source such as a person talking, and transmits its microphone signal in real-time as a wireless audio signal (e.g., a radio frequency, RF, communications signal.) A listening device, which could for example be a wireless headset (e.g., a wireless earbud, or a wireless hearing aid), receives the wireless audio signal from the remote microphone, producing a localized remote microphone signal in the listening device. The listening device also has a local microphone, which receives an acoustic signal from the person talking or other sound source, producing a local microphone signal.

Delay matching is performed in the listening device, to align the localized remote microphone signal, which has a wireless delay due to transmission of the remote microphone signal over an RF communications link with the remote device, and the local microphone signal, which has an acoustic delay that is due to the acoustic path traveled by sound from the sound source. The time-aligned signals may then be matched for signal strength, through a gain adjustment that is determined when neither the distant talker nor the listener are speaking, and fed into a two channel noise suppressor. Output of the noise suppressor drives a speaker of the headset for the listener to hear the noise-reduced (or enhanced) speech of the talker (or a noise-reduced version of other sound that was picked up by the remote and local microphones.)

Some versions of the listening device use a memory and computation efficient cross-correlation and delay estimation technique, in which time slices of two audio signals are combined to reduce sample size in memory. In turn, this reduces the number of multiplications and amount of computation time for cross-correlation of the audio signals, thereby reducing the time needed for delay estimation and alignment of the audio signals, e.g., the local and remote microphone signals, prior to the noise reduction.

FIG. 1 depicts remote listening through a remote microphone 102 that is communicatively coupled to a headset 112, in an acoustic environment with noises 104, 106. By placing the remote microphone 102 close to the talker 108, the signal-to-noise ratio (SNR) in the signal from that microphone 102 is increased, compared with the SNR at the ear of the user or listener 110. In the scenario depicted in FIG. 1, the user of the headset 112 (the listener 110) and the audio source (the talker 108) are in the same acoustic environment (e.g., a room) at a distance D+d from each other, for example between 1 m and 10 m (within Bluetooth or other wireless communications connection range). The remote microphone 102 (and remote device 114) are placed in front of the talker 108 at a distance d much shorter than the distance D from the remote microphone 102 to the headset 112 user and listener 110. One simplifying assumption that can be used in some versions is that d<<D.

If the environment contains ambient noise, for example Noise 1 106 and Noise 2 104, e.g., sufficiently high levels of reverberation, the user, listener 110, has difficulty in hearing the speech of the distant talker 108 when listening directly (i.e., without an electronic device). The remote microphone 102, Min, the headset 112 or other listening device, and various aspects of the listening system described herein, overcome these difficulties. The remote microphone 102 is located in the remote device 114 such as a smart phone or other portable device equipped with wireless connectivity, which is capable of transmitting the microphone signal for example to a paired device such as the headset 112 using a Bluetooth connection or other radiofrequency (RF) connection.

Because of the Bluetooth or other wireless communications technology encoding and decoding process and transmission protocol, the received or "listening device version" of the audio signal from the remote microphone 102, Mic1 will have a delay, herein referred to as wireless delay, relative to the original or "remote device version." This wireless delay may be greater than the acoustic delay, which may be viewed as the time interval needed for the sound (represented or picked up in the local microphone signal from the local microphone 116, Mic2 in the headset 112) to travel through an acoustic path from its acoustic source to the local microphone 116.

Figure 2:
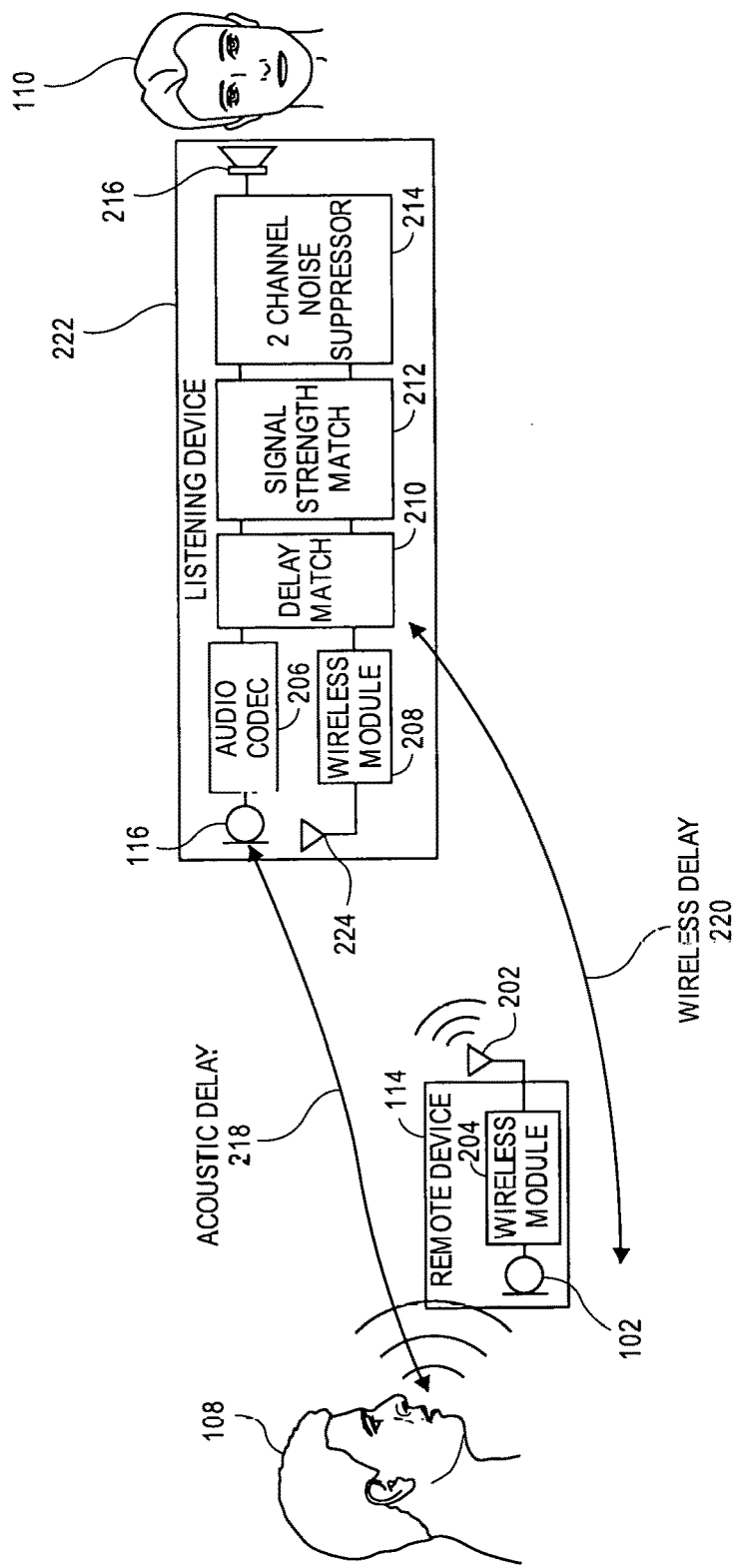
FIG. 2 depicts remote listening using a listening device that adjusts two microphone signals on two paths to match their relative delay and signal strength for noise suppression.

FIG. 2 depicts remote listening through the use of the remote device 114, and a listening device 222 that adjusts audio signals on two paths, to match delays and signal strength for noise suppression. The listener 110 hears speech (or other sounds) from a talker 108 at a distance, through the speaker 216 of the listening device 222. Speech from the talker 108 is picked up by the microphone 102 of the remote device 114, and transmitted through a wireless communications module 204 and antenna 202 of the remote device 114. The transmitted microphone signal is then received through an antenna 224 and a wireless communications module 208 of the listening device 222, with a wireless delay 220 that accounts for the encoding, transmitting, receiving, decoding, protocol and other delays in wireless communication until the speech appears for example at the output of the wireless module 208. That same speech from the talker 108 is also picked up by the local microphone 116 of the listening device 222 and amplified through the audio codec 206, experiencing an acoustic delay 218 that accounts for the distance and sound propagation from the talker 108 to for example the output of the audio codec 206 in the listening device 222.

Speech signals from these two paths, also referred to here as acoustic and wireless paths, are presented to a delay match process 210 that determines a delay of one signal relative to the other, and adjusts signal timing until the two signals are matched in time. For example, the later arriving signal, which is on the wireless path as it is delayed as a result of the wireless delay 220, may simply pass through the delay match process 210 with no further (deliberate) delays. The earlier arriving signal, which is on the acoustic path and is delayed as a result of acoustic delay 218, is then adjustably delayed, for example through a delay buffer, to align in time with the later arriving signal, based on the determined difference between the wireless delay and the acoustic delay.

Now that the speech signals on the two paths are aligned in time, these signals are presented to a signal strength match process 212, which performs gain adjustment to match the two signals in strength when neither the distant talker or the user/listener is speaking. For example, the gain of the adjustable delayed earlier arriving signal could be adjusted, or the gain of the later arriving signal could be adjusted, or both, until signal levels, signal power or other measurement of signal strengths match (while neither the distant talker nor the user/listener is speaking.) With the speech signals on the two paths aligned in both time and strength, the speech signals are presented to the input channels, respectively, of a two channel noise suppressor 214. The noise suppressor 214 could adjust gain on one channel relative to the other, switch between channels, combine channels, subtract noise detected on one channel from the other channel and/or vice versa, reduce gain when no speech is detected, and/or perform other forms of noise suppression based on commonality or differences between the two channels, frequency domain analysis of signals, etc. in order to produce a single, noise reduced audio signal as its output. Output of the noise suppressor 214 is converted to sound through the speaker 216, for the listener 110, who as a result hears sound of the talker with speech enhancement, courtesy of the remote microphone 102 and listening device 222. Various features of the listening device 222 of FIG. 2 are implemented in the remote listening system shown in FIG. 3, and variations thereof.

Figure 3:
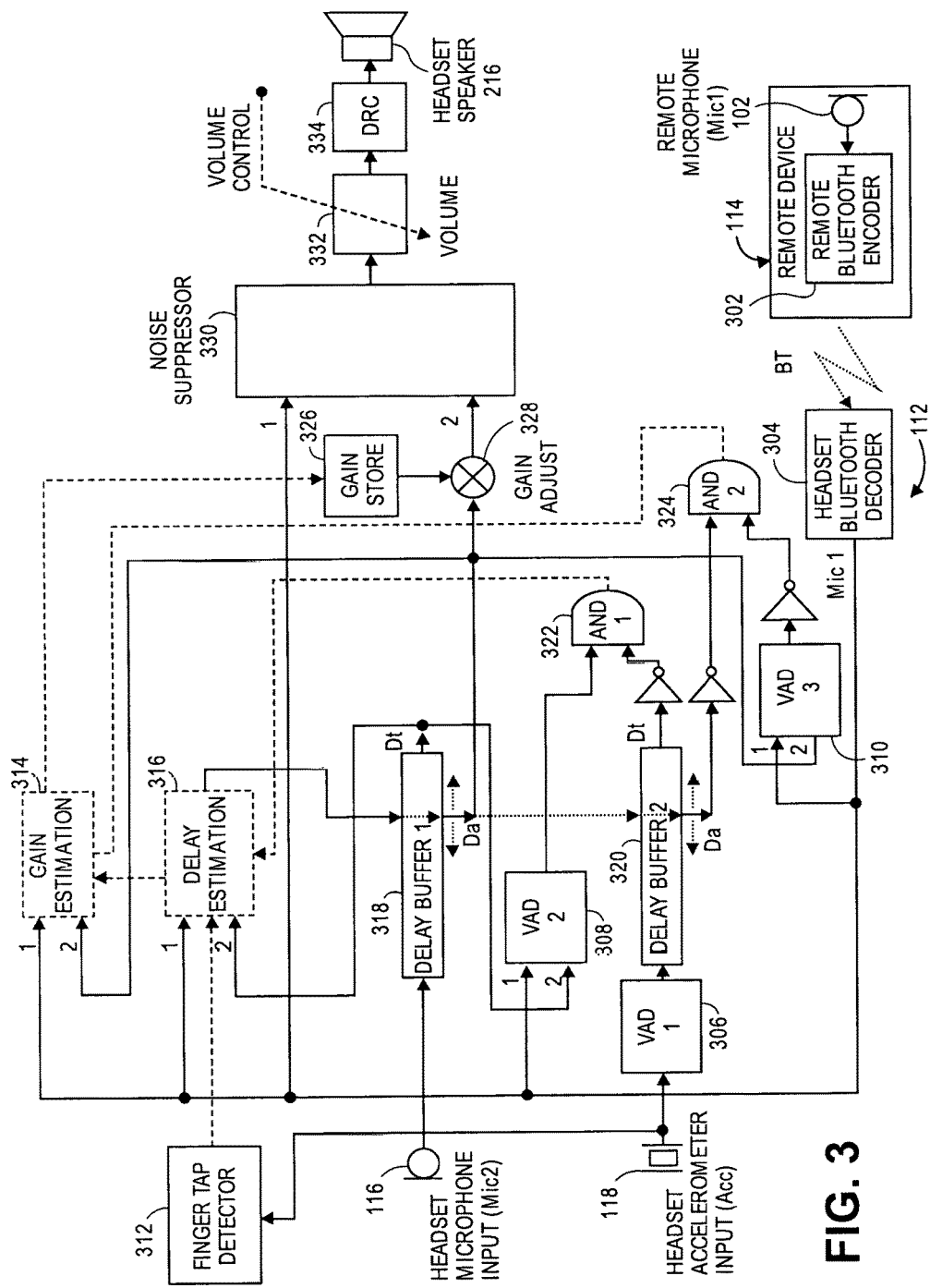
FIG. 3 is a block diagram of an example remote listening system.

FIG. 3 is a block diagram of an example remote listening system having speech enhancement blocks that perform a speech enhancement process as introduced above, to improve a listener's experience. In this version, the headset 112 (see FIG. 1) is equipped with not just the local microphone 116, Mic2, but also an accelerometer 118, Acc that can contemporaneously pick up vibrations due to the talker's speech (e.g., via bone conduction.) It should also be noted that while FIG. 3 shows all of the speech enhancement blocks or operations as being outside of the remote device 114 containing the remote microphone 102, Mic1, an alternative is to configure a digital processor in the remote device 114 to perform some or all of those operations. Performing the speech enhancement signal processing on the headset 112 has the advantage of a lower delay due to not having to deliver the signal from the headset microphone (Mic2) to the remote device 114 (one-way only). In the version shown in FIG. 3, the speech enhancement digital signal processing takes place on the headset 112 (which also contains the headset Bluetooth decoder 304, the finger tap detector 312, the local microphone 116, the accelerometer 118, the volume 332, the DRC 334 and the speaker 216.

The speech enhancement signal processing in the listening device 222 (e.g., headset 112) in this particular example contains three inputs:

a) The remote microphone 102 input (Mic1). This signal contains an inherent relatively large delay, referred to herein as the wireless delay 220 (e.g., 50 ms) due to the wireless encoding, by for example a remote Bluetooth encoder 302, decoding by the headset Bluetooth decoder 304, and over the air transmission of the microphone signal to the headset 112. Of course, wireless modules other than Bluetooth modules could be used.

b) The local microphone 116 input (Mic2), also referred to here as a headset microphone input. When the distant talker 108 speaks, the acoustic signal reaches the listener 110 (or the headset microphone worn by the listener) with an acoustic delay 218 (~3 ms for 1 m to ~30 ms for 10 m) due to the distance between the talker and the listener or user.

c) The accelerometer 118 input (Acc), also referred to here as a headset accelerometer input. This signal is active when the user speaks or taps the headset 112 (e.g., to indicate for example a request to calibrate the speech enhancement process or initiate the speech enhancement process described here).

Figure 4:
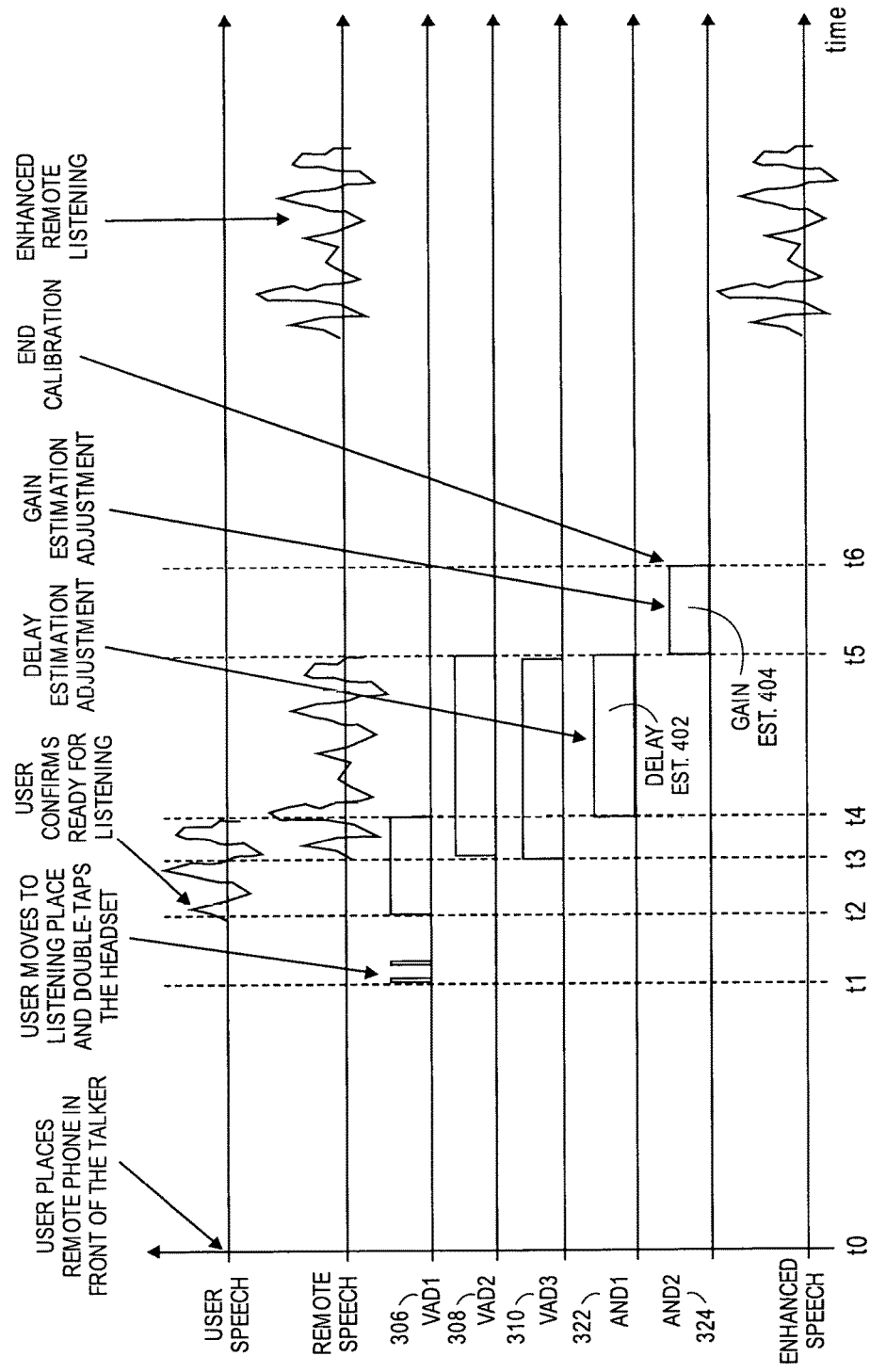
FIG. 4 depicts timing of events in an example operation of a remote listening system.

In some instances, the listening device 222 has a calibration phase in which the actual delay between the inputs a) and b) is estimated (before the delay match process), and the noise level difference between the inputs a) and b) (when neither the distant talker nor the user is speaking, e.g., see FIG. 4, between t5 and t6) is estimated and compensated for (before the signal strength match process).

Components, timing, functionality and operation of the remote listening system of FIG. 3 are further described below with reference to timing diagram FIG. 4.

FIG. 4 depicts timing of events in an example operation of a remote listening system. With reference also to FIGS. 1-3, the user of the headset 112 (listener 110) places the remote microphone 102 (e.g., placing remote device 114) in front of the distant talker 108 at time t0 and moves back to a listening location. The listener 110 then initiates a calibration process, for example by double tapping the headset 112 at time t1. Once the double tap is detected by the accelerometer 118 and the Finger Tap Detector 312, which monitors the accelerometer signal, the calibration process for delay estimation is enabled but does not actually start to process input data until the distant talker starts speaking while the user (listener) is not speaking—here starting at t4. The timing diagram of FIG. 4 shows that before t4, the user/listener begins speaking at t2 (e.g., the user confirms by saying that he is ready for listening) followed by the distant talker joining the conversation at t3. Note however that the user's confirmation that he or she is ready to listen is optional (e.g., the user may simply wait until the distant talker begins the conversation.)

As seen in FIG. 4, the accelerometer signal (containing speech of the user/listener only) is passed to an energy-based voice activity detector 306, VAD1, followed by a delay buffer 320, Delay Buffer 2, set to the delay value Dt of the known wireless delay 220 between remote microphone 102 Mic 1 and headset 112. This VAD1 output can be extended in time by a hangover window (e.g., 100-150 ms) to account for unvoiced consonants, in some versions. Then the output of VAD1 is inverted and applied to one of the inputs of a logic AND 322 block, AND1.

A second voice activity detector 308, VAD2, detects when the distant talker speaks. This VAD2 has two inputs, the remote microphone signal from the headset Bluetooth decoder 304 or other wireless module 208 (see FIG. 2), and the Mic2 signal delayed by a delay buffer 318, Delay Buffer 1, set to the value Dt which is the known wireless delay 220 (e.g., including encoding, decoding and protocol) between remote microphone 102 and headset 112 (e.g., 50 ms). The VAD2 compares the energies/powers in the two channels in each small frame or block of, for example, 1 ms like the first VAD1. When the energy in input 1 is greater than in input 2 of the second voice activity detector 308, it is assumed that the distant talker 108 speaks.

In the example logic shown in FIG. 4, the VAD2 output is combined with the VAD1 delayed-and-inverted output in the AND 322 logic block AND1. When the output of AND1 becomes 1, the delay estimation process 402 starts at t4 (and is represented in FIG. 3 by the dashed-line block, Delay Estimation 316.) This delay estimation process 402 is described below and takes place for only a short duration between t4 and t5 when the distant talker 108 but not the user speaks (e.g., set to 1 or 2 s).

Still referring to FIG. 3, once the Delay Estimation 316 successfully estimates the actual delay (part of the calibration phase), it applies an adjustment to the first delay buffer 318, Delay Buffer 1, and the second delay buffer 320, Delay Buffer 2, by taking the outputs from these buffers 318, 320 at earlier locations Da instead of the initial location Dt (total buffer delay). The adjusted Da output of the Delay Buffer 1 is then passed to the gain multiplication block 328 and after that to the second input of the 2-channel Noise Suppressor 330.

The adjusted Da output of the Delay Buffer 2 is then passed to an inverter and then to a second AND 324 logic block, AND2. When the delay estimation process 402 is complete, the Delay Estimation 316 block signals to the Gain Estimation 314 block at t5 that it should start estimating the noise in its two input channels when the second AND 324 logic block (AND2) sends a triggering signal to do that. This is part of gain estimation process 404 performed between t5 and t6.

A third voice activity detector 310 block (VAD3) makes a more accurate detection of when the distant talker speaks. This VAD3 has two inputs which are processed on short frames/blocks of, e.g., 1 ms each: the remote microphone signal from the headset Bluetooth decoder 304 and the Mic2 signal delayed by the adjusted delay Da from the Delay Buffer 1 after the delay estimation 402 is complete.

The output of VAD3 is then inverted and sent to the second AND 324 block AND2. When the output of AND2 becomes 1 at t5, for a short period of time (for example 200-500 ms), the noise powers in the two channels of the Gain Estimation 314 block are computed. Then, a gain to be applied to the delayed Mic2 by Da is computed from these two powers (by the gain estimation process 404) in such a way that when this gain is applied to the Mic2 (delayed by Da) the noise in this channel equals the noise in the remote microphone Mic1 from the headset Bluetooth decoder 304. Then this gain is stored in the Gain Store 326 block at time t6.

Once the delay estimation process 402 and gain estimation process 404 (or delay estimation and gain estimation phases) are complete, the calibration phase may be deemed complete at which point the user (listener 110) can listen and talk to the distant talker 108 using the remote microphone 102 enhanced by the 2-channel noise suppressor 330. The two channels of the Noise Suppressor 330 are synchronized in time and the signals are matched in order to suppress ambient noise. Some versions of the two-channel noise suppressor 330 use principles of a 2-channel noise suppressor as used in a mobile telephone.

After the noise suppressor 330, a volume 332 block can allow the user to adjust the overall volume, in some versions. This volume 332 block can be followed in some versions by a dynamic range compressor block, DRC 334, which amplifies small sounds and attenuates loud sounds.

At any point in time the user may re-start the calibration process if the noise conditions change or if the distance between the user and the distant talker 108 changes. However, the enhanced remote listening presented in this disclosure can also occur without a calibration phase, in some versions, by processing default Mic2 values of Dt for delay and 0 dB for gain. In this case the quality of the enhanced speech generated by the system may not be as good as when the calibration is performed.

The calibration process (operations performed between t1 and t6) can be repeated at any time such as when ambient noise distribution changes or the distance between talker and user changes. In other instances, the delay estimation & adjustment is not performed, or the gain estimation & adjustment is not performed. Also other methods to trigger the calibration process can be employed, such as to trigger automatically after a set time of a few seconds from the start of the listening session at t0.

Figure 5:
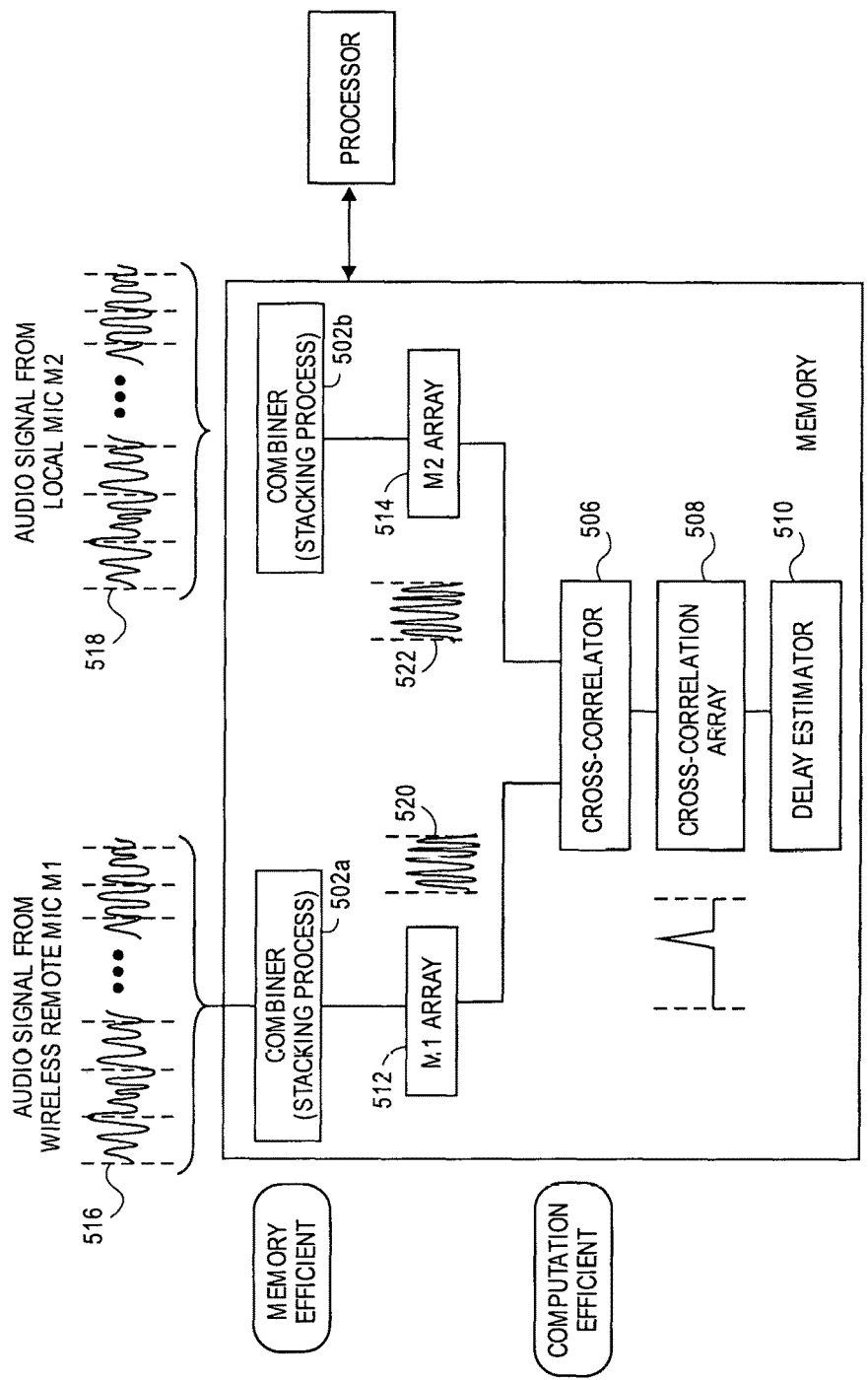
FIG. 5 depicts memory and computation efficient cross-correlation of audio signals, for use in delay estimation in the remote listening system.

FIG. 5 depicts a block diagram of a process for memory and computation efficient digital signal processing of audio signals, for use in for example the delay estimation 316 in the remote listening system of FIG. 3. The block diagram shows how a processor is configured according to various routines stored in memory to perform the prescribed digital signal processing operations on data structures stored in the memory. Before describing that process however, consider a standard approach to delay estimation which relies on a cross-correlation technique whereby the delay between two similar signals corresponds to the offset of a peak in the cross-correlation function of the two. For example, in the case of FIG. 3, when VAD1=1, this indicates that there is a segment of a User voice present in Mic2 input, and an acoustically similar segment will appear in the second input (the remote microphone Mid coming from the wireless link). In order to have a strong and distinctive peak in the cross-correlation measure between the Mic2 and Mic1 inputs, the segments need to be of some minimum length in order to find a similar acoustic signature in both. Typical lengths of around 1-2 seconds, which corresponds to the length of a short utterance, would give satisfactory results even in some noisy conditions.

In a real-time implementation on embedded platforms with limited memory resources, a conventional delay estimation technique would require significant storage space in memory. For example, if the calibration signal is 1 [sec] long, then that would require memory storage of ~128 [kB] (assuming typical sampling rate of 16 kHz):
M1 array=1 [sec]=16000 [samples]=32000 [Bytes]=~32 [kB]
M2 array=~32 [kB]
Cross-Correlation Array=~64 [kB]

An efficient mechanism and method are described in connection with FIG. 5, which reduce memory requirements for cross-correlation based delay measurement. In this method, it is not required to contiguously store the two signals of interest, before performing cross-correlation on them. Instead, each signal is partitioned into a sequence of short-segments, for example 100 msec long each, which are stacked on top of each other through a respective combiner 502a, 502b, i.e. the stacking process 504 accumulates a sum of short segments in a small array 512, 514 (in this example, 3200 Bytes which corresponds to 100 msec @ 16 kHz @ 2 bytes/sample). When each audio signal, e.g., having a total length of 1 second (see FIG. 5) is compacted in this manner into its own 100 msec array 512, 514, then the cross-correlation is performed upon these two arrays 512, 514 of 100 msec, instead of upon the original 1 sec arrays. This corresponds to a 10 times reduction in the size of arrays. Then, the delay measurement is performed by the Delay Estimator 510, also on the reduced arrays of, e.g., 100 msec, using known techniques such as cross-correlation or normalized cross-correlation (for example using a Generalized Cross-Correlation Phase Transform).

Using this stacking technique, the total memory requirement in the above example could be reduced from 128 kB to ~12 kB, while at the same time maintaining the quality of having a strong and distinctive peak in the cross-correlation measure. A sequence of ten individual 100 msec sub-segments of the calibration utterance are added on top of each other into an input buffer of the Cross-Correlator 506. The same process is done in parallel for both Mic1 and Mic2 signals. In this scenario, as depicted in FIG. 5, the audio signal 516 from the wireless remote microphone 102, in the listening device 222, is divided into 100 ms sub-segments and input into a combiner 502a. Through the stacking process 504, the sub-segments are combined, for example by adding signal values (e.g., amplitudes) at respective offsets into the segments, into a combined or merged segment 520 that is stored in the M1 Array 512.

Similarly, the audio signal 518 from the local microphone 116 in the listening device 222 is divided into 100 ms sub-segments and input into a combiner 502b. Again through the stacking process 504, the sub-segments are combined into a combined or merged segment 522 that is stored in the M2 Array 514. Other combination or merging processes are readily devised to produce combined segments that are smaller than the size of the original audio signal samples (sequence), and accordingly take less memory to store, and these can be implemented in other variations of the efficient cross-correlation process described here.

Cross-Correlator 506 cross-correlates contents of the M1 Array 512 and the M2 Array 514, i.e., the combined or merged segment 520 and the combined or merged segment 522 are cross-correlated, and stores the resultant values in the cross-correlation array 508. Because the stacking process 504 reduces the total number of values to be stored in the arrays 512, 514, which in turn reduces the amount of data that is to be stored in the Cross-Correlation Array 508, the overall cross-correlation process is more memory efficient than standard cross-correlation techniques. In addition, the Cross-Correlator 506 is computationally efficient, because a fewer number of data points is input into the cross-correlation algorithm, and a fewer number of multiplications are performed in the cross-correlation algorithm.

Based on the results of cross-correlation, a processor could determine whether two audio signals have a similar acoustic signature. If the cross-correlation method does not yield a strong and distinctive peak in its output, it would be an indication that the remote microphone (Mid) is, for example, in a different room (different acoustic environment), and the system (e.g., Delay Estimator 510) may in that case decide to not perform the Delay Estimation/Adjustment operation in FIG. 3.

With ongoing reference to FIGS. 3 and 4, a Gain Estimation and Adjustment is performed after the Delay Estimation/Adjustment. After the delay between remote microphone Mid. and the headset microphone Mic2 (where the latter was delayed by wireless delay Dt) is estimated and adjusted on Mic2, the estimation of the necessary gain to be applied on Mic2 can proceed at time t5. This condition will take place in a short set segment of say 200-500 ms when neither the user (listener) nor the distant talker speaks as controlled by the AND2 and VAD1 and VAD3 blocks. In such condition the Gain Estimation block measures the noise power levels in the two input signals (1 and 2). Then the difference between the two powers is converted in magnitude and it is stored in the Gain Store block and then applied to the Mic2 delayed by the adjusted delay Da.

This way the background noise levels in the two inputs (1 and 2) of the 2-channel Noise Suppressor are approximately the same and thus the Noise Suppressor is able to continuously estimate the noise and apply the necessary suppression on it. The Noise Suppressor applies suppression on both stationary and non-stationary ambient noises and during both periods of time when the distant talker is speaking or not speaking.

In an example scenario (see FIGS. 1-4), the noise and speech spectra in Mic1 and Mic2 delayed by Da differ due to non-uniform distribution of ambient noise between the distant talker and the user/listener. A gain adjustment of, for example, −5 dB brings the two noise spectra closer to each other and thus allows the Noise Suppressor to suppress the ambient noises.

With reference to FIGS. 1-5, various components of the listening system described herein can be implemented in hardware, software executing on one or more processors, firmware, or combinations thereof. Two or more related components can be implemented as a single component with multiplexing, time-sharing, timeslicing or multithreaded operation, for example. Sections of logic can be implemented with equivalent logic or variations of logic as hardware, or in software or firmware, etc.

While certain aspects have been described and shown in the accompanying drawings, it is to be understood that such are merely illustrative of and not restrictive on the broad invention, and that the invention is not limited to the specific constructions and arrangements shown and described, since various other modifications may occur to those of ordinary skill in the art. For example, while FIG. 4 depicts timing for a device in which double taps initiate calibration, it is also possible to have calibration initiated by recognition of a phrase, changes in other signals, etc. Also, one application of the memory and computation efficient cross-correlation technique is delay estimation, and where the delay of a delay buffer is set in accordance with the cross-correlation result; such an adjustment of timing or synching of the two audio signals is however but one specific system application of the technique. Other applications might not need such adjustment but rather would only need the delay estimation. The description is thus to be regarded as illustrative instead of limiting.

As described above, one aspect of the present technology may involve gathering and use of data available from various sources. The present disclosure contemplates that in some instances, this gathered data may include personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, a user may wish to better hear personal information. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates instances in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed aspects, the present disclosure also contemplates that the various embodiments can also be implemented without the need for accessing such personal information data. That is, the various aspects of the present technology are not rendered inoperable due to the lack of all or a portion of such personal information data. For example, live listening can take place based on non-personal information data or a bare minimum amount of personal information, such as the content being requested by the device associated with a user, other non-personal information available to the listener, or publicly available information.

To aid the Patent Office and any readers of any patent issued on this application in interpreting the claims appended hereto, Applicant wishes to note that they do not intend any of the appended claims or claim elements to invoke 35 U.S.C. 112(f) unless the words "means for" or "step for" are explicitly used in the particular claim.

What is claimed is:

1. A memory-efficient and computation-efficient cross-correlator for audio signals, comprising:
 a first array in memory;
 a second array in memory;
 a cross-correlation array in memory;
 a processor configured to receive a first audio signal, partition a first segment of the first audio signal into a first plurality of shorter segments, combine the first plurality of shorter segments into a first combined segment that is less than a size of the first segment, and write the first combined segment into the first array;
 the processor configured to receive a second audio signal, partition a second segment of the second audio signal into a second plurality of shorter segments, and combine the second plurality of shorter segments into a second combined segment that is less than a size of the second segment, and write the second combined segment into the second array; and
 the processor configured to cross-correlate the first combined segment, from the first array, and the second combined segment, from the second array, into a cross-correlation result and write the cross-correlation result into the cross-correlation array.

2. The memory-efficient and computation-efficient cross-correlator for audio signals of claim 1, wherein:
 the first combined segment and the second combined segment are a same size; and
 the cross-correlation array is twice a size of each of the first array and the second array.

3. The memory-efficient and computation-efficient cross-correlator for audio signals of claim 1, wherein:
 each of the first plurality of shorter segments, and the first combined segment, is one tenth or less of a size of the first segment; and
 each of the second plurality of shorter segments, and the second combined segment, is one tenth or less of a size of the second segment.

4. The memory-efficient and computation-efficient cross-correlator for audio signals of claim 1 wherein the processor is configured to determine a delay offset of the second audio signal relative to the first audio signal, based on the cross-correlation result.

5. The memory-efficient and computation-efficient cross-correlator for audio signals of claim 1, further comprising:
 a delay buffer to receive the second audio signal; and
 the processor configured to set a delay of the delay buffer in accordance with the cross-correlation result, to match timing of the first audio signal and the second audio signal.

6. The memory-efficient and computation-efficient cross-correlator for audio signals of claim 1, wherein memory requirements are reduced as a result of using the first combined segment and the second combined segment for the cross-correlation, in comparison to using the first segment of the first audio signal and the second segment of the second audio signal for cross-correlation.

7. The memory-efficient and computation-efficient cross-correlator for audio signals of claim 1, wherein computation of the cross-correlation is more efficient as a result of using the first combined segment and the second combined segment for the cross-correlation, in comparison to using the first segment of the first audio signal and the second segment of the second audio signal for the cross-correlation.

8. The memory-efficient and computation-efficient cross-correlator for audio signals of claim 1, further comprising:
 the processor to determine to perform a delay estimation or adjustment of timing of the second audio signal relative to the first audio signal, based on a peak of the cross-correlation result.

9. The memory-efficient and computation-efficient cross-correlator for audio signals of claim 1, further comprising:
 the processor to determine whether the first audio signal and the second audio signal have a similar acoustic signature, based on the cross-correlation result.

10. The memory-efficient and computation-efficient cross-correlator for audio signals of claim 1, wherein:
 to combine the first plurality of shorter segments into the first combined segment, the processor is to add together signal amplitudes at corresponding offsets in each of the first plurality of shorter segments; and
 to combine the second plurality of shorter segments into the second combined segment, the processor is to add together signal amplitudes at corresponding offsets in each of the second plurality of shorter segments.

11. A memory-efficient and computation-efficient method for cross-correlating audio signals, performed by a processor, comprising:
 partitioning a first segment of a first audio signal into a first plurality of shorter segments;
 combining the first plurality of shorter segments into a first combined segment that is less than a size of the first segment, in a first array in memory;

partitioning a second segment of a second audio signal into a second plurality of shorter segments;

combining the second plurality of shorter segments into a second combined segment that is less than a size of the second segment, in a second array in memory;

cross-correlating the first combined segment, from the first array, and the second combined segment, from the second array, into a cross-correlation result in a cross-correlation array in memory;

determining a delay offset between the second audio signal and the first audio signal, based on the cross-correlation result; and producing an audio signal for driving a speaker to produce sound, in accordance with the determined delay offset.

12. The memory-efficient and computation-efficient method of claim 11, wherein:

the combining of the second plurality of shorter segments comprises combining the second plurality of shorter segments into the second combined segment that is a same size as the first combined segment; and the cross-correlating comprises cross-correlating the first combined segment and the second combined segment into the cross-correlation array that is essentially twice a size of each of the first array and the second array.

13. The memory-efficient and computation-efficient method of claim 11, wherein:

the partitioning the first segment comprises partitioning the first segment into the first plurality of short segments each of which is one tenth or less of a size of the first segment, as is the first combined segment; and the partitioning the second segment comprises partitioning the second segment into the second plurality of short segments each of which is one tenth or less of a size of the second segment, as is the second combined segment.

14. The memory-efficient and computation-efficient method of claim 11 wherein producing the audio signal comprises:

adjusting relative delay between the first and second audio signals in accordance with the determined delay offset; and performing a noise suppression process upon the first and second audio signals with adjusted relative delay to produce the audio signal that is driving the speaker.

15. The memory-efficient and computation-efficient method of claim 11, further comprising:

setting a delay of a delay buffer in accordance with the cross-correlation result, to match timing of the first audio signal and the second audio signal.

16. The memory-efficient and computation-efficient method of claim 11, wherein using the first combined segment and the second combined segment for the cross-correlation reduces memory requirements in comparison to using the first segment of the first audio signal and the second segment of the second audio signal for cross-correlation.

17. The memory-efficient and computation-efficient method of claim 11, wherein using the first combined segment and the second combined segment for the cross-correlating is more efficient, in comparison to using the first segment of the first audio signal and the second segment of the second audio signal for the cross-correlating.

18. The memory-efficient and computation-efficient method of claim 11, further comprising:

adjusting timing of the second audio signal relative to the first audio signal, based on a peak of the cross-correlation result.

19. The memory-efficient and computation-efficient method of claim 11, further comprising:

determining whether the first audio signal and the second audio signal have a similar acoustic signature, based on the cross-correlation.

20. The memory-efficient and computation-efficient method of claim 11, wherein:

the combining of the first plurality of shorter segments into the first combined segment comprises adding together signal amplitudes at corresponding offsets in each of the first plurality of shorter segments; and the combining of the second plurality of shorter segments into the second combined segment comprises adding together signal amplitudes at corresponding offsets in each of the second plurality of shorter segments.

* * * * *